United States Patent
No et al.

(10) Patent No.: US 11,177,672 B2
(45) Date of Patent: Nov. 16, 2021

(54) BATTERY PACK AND DATA TRANSMISSION METHOD OF BATTERY PACK

(71) Applicant: Samsung SDI Co., Ltd., Yongin-si (KR)

(72) Inventors: Inhye No, Yongin-si (KR); Kumyul Hwang, Yongin-si (KR)

(73) Assignee: Samsung SDI Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/530,532

(22) Filed: Aug. 2, 2019

(65) Prior Publication Data

US 2019/0356144 A1 Nov. 21, 2019

Related U.S. Application Data

(63) Continuation of application No. PCT/KR2017/014926, filed on Dec. 18, 2017.

(30) Foreign Application Priority Data

Feb. 2, 2017 (KR) ........................ 10-2017-0015130

(51) Int. Cl.
*H02J 7/00* (2006.01)
*H01M 10/42* (2006.01)
*H01M 10/48* (2006.01)

(52) U.S. Cl.
CPC ......... *H02J 7/0021* (2013.01); *H01M 10/425* (2013.01); *H01M 10/482* (2013.01);
(Continued)

(58) Field of Classification Search
CPC .............................. H02J 7/0021; H01M 10/486
See application file for complete search history.

(56) References Cited

U.S. PATENT DOCUMENTS 7,492,126 B2    2/2009  Hogari et al.
2008/0018306 A1 1/2008  Shin et al.
(Continued)

FOREIGN PATENT DOCUMENTS

JP      2013-101884 A    5/2013
KR  10-2005-0089645 A    9/2005
(Continued)

OTHER PUBLICATIONS

International Search Report and Written Opinion of the International Searching Authority dated Mar. 30, 2018 for International Patent Application No. PCT/KR2017/014926 filed Dec. 18, 2017, of which subject U.S. Appl. No. 16/530,532 is a Continuation, each of which claims priority from Korean Patent Application No. KR 10-2017-0015130 filed Feb. 2, 2017.

*Primary Examiner* — Drew A Dunn
*Assistant Examiner* — Tynese V McDaniel
(74) *Attorney, Agent, or Firm* — Knobbe, Martens, Olson & Bear, LLP

(57) ABSTRACT

The described technology relates to a battery pack and a data transmission method for the battery pack. In one embodiment, the battery pack includes a battery comprising at least one battery cell and a controller configured to check a state of the battery and generate a battery state signal corresponding to the state of the battery. The battery pack also includes a switch circuit configured to operate based on the battery state signal and a resistor circuit configured to be electrically connected to a reference node through the switch circuit. The switch circuit is configured to make or break electrical connection between the resistor circuit and the reference node based on the battery state signal.

18 Claims, 6 Drawing Sheets

(52) U.S. Cl.
CPC ......... *H01M 10/486* (2013.01); *H02J 7/0063* (2013.01); *H01M 2010/4271* (2013.01); *H01M 2010/4278* (2013.01)

(56) References Cited

U.S. PATENT DOCUMENTS

| | | | |
|---|---|---|---|
| 2010/0308774 A1* | 12/2010 | Park | H02J 7/0091 320/153 |
| 2011/0080140 A1* | 4/2011 | Hogari | H01M 10/637 320/134 |
| 2012/0074950 A1 | 3/2012 | Heo | |
| 2014/0079960 A1* | 3/2014 | Yun | H01M 10/482 429/7 |
| 2014/0344499 A1* | 11/2014 | Uemura | G06F 13/4086 710/313 |
| 2016/0118840 A1* | 4/2016 | Shinoda | H02J 2207/40 320/108 |

FOREIGN PATENT DOCUMENTS

| | | |
|---|---|---|
| KR | 10-0845320 B1 | 7/2008 |
| KR | 10-1027104 B1 | 3/2011 |
| KR | 10-1162363 B1 | 6/2012 |
| KR | 10-2014-0033811 A | 3/2014 |
| KR | 10-1429771 B1 | 8/2014 |

* cited by examiner

FIG. 3

| BATTERY TEMPERATURE | CONNECTOR-REFERENCE IMPEDANCE (ohm) | IMPEDANCE (ohm) | CHARGING CONTROL | TURNED-ON SWITCH |
|---|---|---|---|---|
| T < −10°C | > 37.04K | 62K | NO CHARGING (LOW TEMPERATURE) | Q16 |
| −10°C ≤ T < 0°C | 21.35K ~ 35.18K | 33K | CHARGING AT 1A OR LESS | Q18 |
| 0°C ≤ T < 10°C | 13.28K ~ 21.35K | 14K | CHARGING AT 2A | Q10 |
| 10°C ≤ T < 50°C | 2.44K ~ 13.28K | 8.41K | CHARGING AT 8A | Q16, Q18, Q10 |
| 50°C ≤ T < 55°C | 2.018K ~ 2.44K | 2.2K | CHARGING AT 4A | Q9 |
| 55°C < T | < 2.018K | 1.9K | NO CHARGING (HIGH TEMPERATURE) | Q9, Q10 |

BATTERY PACK AND DATA TRANSMISSION METHOD OF BATTERY PACK

CROSS-REFERENCE TO RELATED APPLICATIONS

This application is a continuation application and claims the benefit under 35 U.S.C. §§ 120 and 365 of PCT Application No. PCT/KR2017/014926, filed on Dec. 18, 2017, which is hereby incorporated by reference. PCT/KR2017/014926 also claimed priority to Korean Patent Application No. 10-2017-0015130 filed on Feb. 2, 2017, which is hereby incorporated by reference.

BACKGROUND

Field

The described technology generally relates to a battery pack and a data transmission method for use with the battery pack.

Description of the Related Technology

Recently, battery packs have been undergoing steady development due to their broader uses relating to electric vehicles, energy storage devices, etc. In particular, techniques for sensing the state of battery packs such as temperature have been developed for assisting with the charging, discharging, and management of battery packs.

In such techniques, a battery pack generally includes a temperature sensor for sensing its temperature, and an external device to be coupled to the battery pack also includes a temperature sensor for sensing the temperature of the battery pack. This redundancy of temperature sensors provides fault tolerance in case once one sensor fails.

SUMMARY OF CERTAIN INVENTIVE ASPECTS

One inventive aspect is a battery pack that can maintain battery functionality even though a single sensor is used, and a data transmission method for use with the battery pack.

Another aspect is a battery pack that can reduce manufacturing and assembly costs by using a single sensor, and a data transmission method for use with the battery pack.

Another aspect is a battery pack that can reduce manufacturing costs by using inexpensive resistors and switches and improve compatibility with external devices by using a resistor unit to implement a sensor returning temperatures as impedance values, and also provide a data transmission method for use with the battery pack.

Another aspect is a battery pack that may include: a battery including at least one battery cell; a controller configured to check a state of the battery and generate a battery state signal corresponding to the state of the battery; a resistor unit configured to be electrically connected to a reference node by a switch unit that operates based on the battery state signal; and the switch unit configured to make or break electrical connection between the resistor unit and the reference node based on the battery state signal.

The resistor unit may include one or more resistors, and the switch unit may include one or more switches that are configured to make or break electrical connection between the reference node and the one or more resistors, respectively.

The battery state signal may include a wave in which one or more levels are arranged in a time sequential manner, and the switch unit may be configured to, based on the battery state signal, make or break electrical connection between the reference node and resistors respectively corresponding to the one or more levels.

The battery pack may further include a sensor configured to sense the state of the battery. In this case, the controller may be configured to generate the battery state signal based on the state of the battery sensed by the sensor.

The sensor may include a temperature sensor configured to sense a temperature of the battery, and the battery pack may further include a connector configured to connect the resistor unit to an external device.

The controller may be configured to generate the battery state signal to adjust impedance between the connector and the reference node to a value corresponding to the temperature of the battery sensed by the sensor.

The battery pack may further include a surge remover configured to remove a surge arising along a connection line between the connector and the resistor unit.

The state of the battery may include at least one selected from the group consisting of a temperature of the battery, a voltage of the battery, a charge current to the battery, a discharge current of the battery, remaining electricity of the battery, a number of charge cycles of the battery, and identification information of the battery.

The controller may be configured to generate the battery state signal only when the battery pack is connected to a charging device.

Another aspect is a data transmission method for a battery pack including a battery that may include: checking a state of the battery and generating a battery state signal corresponding to the state of the battery, the checking of the state of the battery and the generating of the battery state signal being performed by a controller; and making or breaking electrical connection between a resistor unit and a reference node based on the battery state signal, the making and breaking of the electrical connection being performed by a switch unit.

In this case, the resistor unit may include one or more resistors, and the switch unit may include one or more switches that are configured to make or break electrical connection between the reference node and the one or more resistors, respectively.

The battery state signal may include a wave in which one or more levels are arranged in a time sequential manner, and the making or breaking of the electrical connection may include making or breaking, based on the battery state signal, electrical connection between the reference node and resistors respectively corresponding to the one or more levels.

Prior to the generating of the battery state signal, the data transmission method may further include sensing the state of the battery using a sensor, wherein the generating of the battery state signal may include generating the battery state signal based on the state of the battery sensed by the sensor.

The sensor may include a temperature sensor configured to sense a temperature of the battery.

The generating of the battery state signal may include generating the battery state signal to adjust impedance between a connector and the reference node to a value corresponding to the temperature of the battery sensed by the sensor, and the connector may connect the resistor unit to an external device.

The generating of the battery state signal may be performed only when the battery pack is connected to a charging device.

Another aspect is a battery pack comprising: a battery comprising at least one battery cell; a controller configured to check a state of the battery and generate a battery state signal corresponding to the state of the battery; a switch circuit configured to operate based on the battery state signal; and a resistor circuit configured to be electrically connected to a reference node through the switch circuit, wherein the switch circuit is configured to make or break electrical connection between the resistor circuit and the reference node based on the battery state signal.

In the above battery pack, the resistor circuit comprises a plurality of resistors, and wherein the switch circuit comprises a plurality of switches respectively configured to make or break electrical connection between the reference node and the resistors. In the above battery pack, the battery state signal comprises a waveform in which one or more levels are arranged in a time sequential manner, and wherein the switch circuit is configured to, based on the battery state signal, make or break electrical connection between the reference node and resistors respectively corresponding to the one or more levels.

The above battery pack further comprises: a sensor configured to sense the state of the battery, wherein the controller is configured to generate the battery state signal based on the state of the battery sensed by the sensor. In the above battery pack, the sensor comprises a temperature sensor configured to sense a temperature of the battery, and wherein the battery pack further comprises a connector configured to connect the resistor circuit to an external device. In the above battery pack, the controller is configured to generate the battery state signal to adjust impedance between the connector and the reference node to a value corresponding to the temperature of the battery sensed by the sensor.

The above battery pack further comprises: a surge removal circuit configured to remove a surge arising along a connection line between the connector and the resistor circuit. In the above battery pack, the state of the battery comprises: at least one of the following: a temperature of the battery, a voltage of the battery, a charge current to the battery, a discharge current of the battery, remaining electricity of the battery, a number of charge cycles of the battery, and identification information of the battery. In the above battery pack, the controller is configured to generate the battery state signal only when the battery pack is connected to a charging device.

Another aspect is a data transmission method for a battery pack including a battery, the data transmission method comprising: at a controller, checking a state of the battery and generating a battery state signal corresponding to the state of the battery; and making or breaking, at a switch circuit, electrical connection between a resistor circuit and a reference node based on the battery state signal, wherein the resistor circuit comprises a plurality of resistors, and wherein the switch circuit comprises a plurality of switches configured to respectively make or break electrical connection between the reference node and the resistors.

In the above data transmission method, the battery state signal comprises a waveform in which one or more levels are arranged in a time sequential manner, and wherein the making or breaking of the electrical connection comprise making or breaking, based on the battery state signal, electrical connection between the reference node and resistor respectively corresponding to the one or more levels.

In the above data transmission method, prior to the generating of the battery state signal, the data transmission method further comprises sensing the state of the battery using a sensor, and wherein the generating of the battery state signal comprises generating the battery state signal based on the state of the battery sensed by the sensor.

In the above data transmission method, the sensor comprises a temperature sensor configured to sense a temperature of the battery. In the above data transmission method, the generating of the battery state signal comprises generating the battery state signal to adjust impedance between a connector and the reference node to a value corresponding to the temperature of the battery sensed by the sensor, and wherein the connector connects the resistor circuit to an external device. In the above data transmission method, the generating of the battery state signal is performed only when the battery pack is connected to a charging device.

Another aspect is a battery pack comprising: a battery comprising at least one battery cell; a controller configured to check a state of the battery and generate a battery state signal corresponding to the state of the battery; a switch circuit configured to operate based on the battery state signal; a resistor circuit configured to be electrically connected to a reference node through the switch circuit; and a connector configured to connect the resistor circuit to an external device having no switch circuit therein.

In the above battery pack, the switch circuit is configured to make or break electrical connection between the resistor circuit and the reference node based on the battery state signal. The above battery pack further comprises a sensor configured to sense the state of the battery, wherein the controller is configured to check the state of the battery sensed by the sensor. In the above battery pack, the sensor comprises a temperature sensor configured to sense a temperature of the battery, and wherein the controller is configured to generate the battery state signal to adjust impedance between the connector and the reference node to a value corresponding to the temperature of the battery sensed by the sensor. In the above battery pack, the controller is configured to generate the battery state signal only when the battery pack is connected to a charging device.

According to at least one of the disclosed embodiments, a battery pack that can maintain battery functionality may be realized even though a single sensor is used, and a data transmission method for the battery packs may be provided.

In addition, it is possible to provide a battery pack that can reduce manufacturing and assembly costs by using a single sensor, and a data transmission method for the battery pack.

Furthermore, it is possible to provide a battery pack that can reduce manufacturing costs by using inexpensive resistors and switches and improve compatibility with external devices by using a resistor unit to implement a sensor returning temperatures as impedance values, and to provide a data transmission method for the battery pack.

BRIEF DESCRIPTION OF THE DRAWINGS

FIG. 3 illustrates operations of switches according to battery temperatures.

DETAILED DESCRIPTION OF CERTAIN INVENTIVE EMBODIMENTS

Figure 1A:
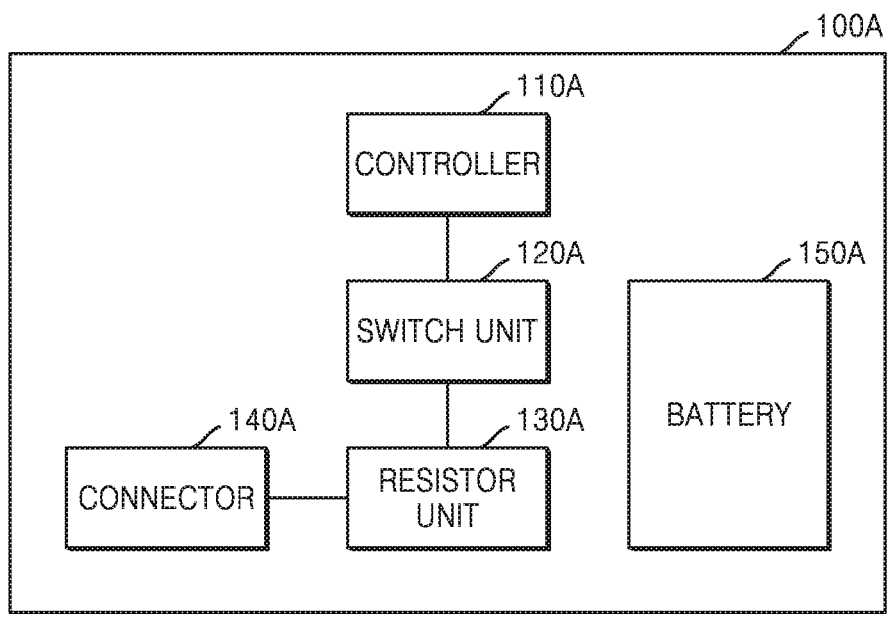
FIGS. 1A to 1D illustrate structures of battery packs according to various embodiments of the present disclosure.

When each of a battery pack and an external device includes a temperature sensor, for the purpose of redundancy and fault tolerance, the manufacturing costs of battery packs increase because of expensive sensors and the assembly cost of battery packs increases.

Advantages and features of the present disclosure, and implementation methods thereof will be clarified through the following descriptions given with reference to the accompanying drawings. However, the following embodiments of the present disclosure are non-limiting examples and may have different forms, and it should be understood that the idea and technical scope of the present disclosure cover all the modifications, equivalents, and replacements. Rather, these embodiments are provided so that this disclosure will be thorough and complete, and will fully convey the scope of the present disclosure to those skilled in the art. Moreover, detailed descriptions related to well-known functions or configurations will be omitted in order not to unnecessarily obscure subject matters of the present disclosure.

For example, specific shapes, structures, and features described in one example embodiment may be modified in another example embodiment without departing from the scope of the present disclosure. In addition, the positions or arrangement of elements described in one example embodiment may be changed in another example embodiment within the scope of the present disclosure. That is, the following description is provided for illustrative purposes only and is not intended to limit the scope of the present disclosure. The scope of the present disclosure is defined by the claims and equivalents thereof. In the drawings, similar or identical elements in many aspects are denoted with the same reference numbers. Details described in the present disclosure are examples. That is, such details may be changed in other example embodiments within the spirit and scope of the present disclosure.

It will be understood that although the terms "first," "second," etc. may be used herein to describe various elements, these elements should not be limited by these terms. These terms are only used to distinguish one element from another.

The terminology used herein is for explaining specific embodiments only and is not intended to limit the scope of the present disclosure. The terms of a singular form may include plural forms unless otherwise mentioned. It will be understood that terms such as "comprise," "include," and "have," when used herein, specify the presence of features, integers, steps, operations, elements, components, or combinations thereof, but do not preclude the presence or addition of one or more other features, integers, steps, operations, elements, components, or combinations thereof. It will be understood that although the terms "first" and "second" are used herein to describe various elements, these elements should not be limited by these terms. These terms are only used to distinguish one element or component from other elements or components.

Hereinafter, embodiments will be described in detail with reference to the accompanying drawings. In the drawings, identical or corresponding elements are denoted with the same reference numbers, and overlapping descriptions thereof will be omitted.

FIGS. 1A to 1D illustrate structures of battery packs 100A, 100B, 100C, and 100D according to various embodiments of the present disclosure. FIGS. 1A-1D show only some components of a battery pack, but various types of components may be additionally provided. Furthermore, certain elements can be removed, two or more elements combined or one element can be separated into multiple elements depending on the specification and requirements.

First, referring to FIG. 1A, the battery pack 100A according to an embodiment of the present disclosure may include a controller 110A, a switch unit (or switch circuit) 120A, a resistor unit (or resistor circuit) 130A, a connector 140A, and a battery 150A.

The controller 110A may check the state of the battery 150A and generate a battery state signal corresponding to the checked state. To this end, the controller 110A may include any type of device such as a processor that can process data. Here, the "processor" may refer to a data processing device included in hardware and having a physically structured circuit to execute codes of programs or functions expressed with instructions. Examples of the data processing device included in hardware may include a microprocessor, a central processing unit (CPU), a processor core, a multiprocessor, an application-specific integrated circuit (ASIC), and a field programmable gate array (FPGA). However, the scope of the present disclosure is not limited thereto.

The "state" of the battery 150A may refer to any one of the temperature, voltage, charge current, discharge current, remaining electricity, number of charge cycles, and identification information of the battery 150A.

In addition, the controller 110A may perform various operations based on the state of the battery 150A in addition to checking the state of the battery 150A and generating the battery state signal as described above. For example, the controller 110A may perform functions such as overcharge protection, overdischarge protection, overcurrent protection, overvoltage protection, overheat protection, or cell balancing for at least one battery cell included in the battery 150A.

Therefore, the controller 110A may include, for example, a battery management system (BMS) or may be a BMS. However, this is an example, and the idea of the present disclosure is not limited thereto.

The resistor unit 130A may include one or more resistors. In this case, the one or more resistors of the resistor unit 130A may be electrically connected to a reference node via the switch unit 120A which is described later.

Figure 2:
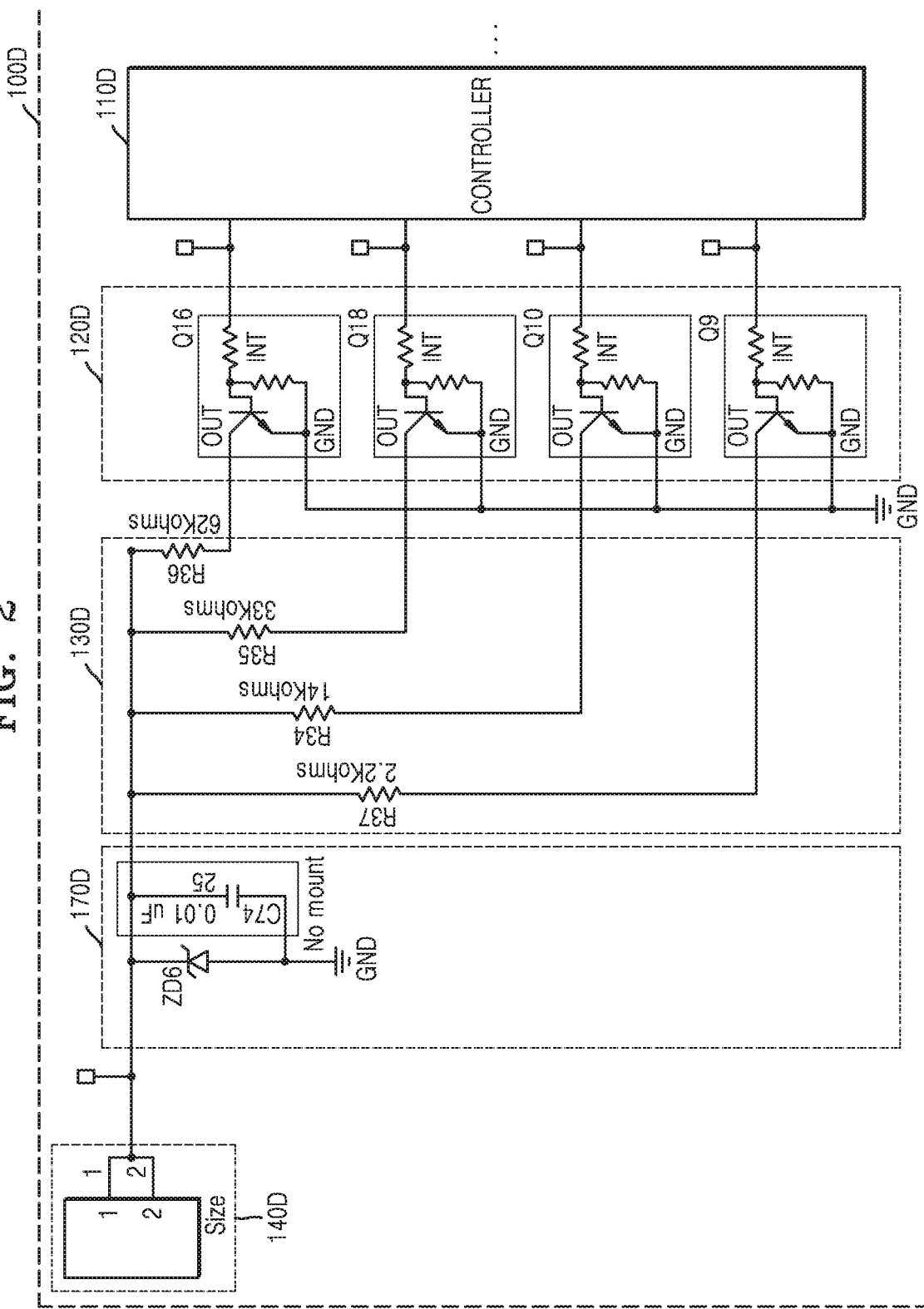
FIG. 2 illustrates an example in which a portion of the structure of the battery pack shown in FIG. 1D is implemented as a circuit.

In the present disclosure, the reference node may mean a node having a particular constant voltage. For example, the reference node may refer to ground (GND) as shown in FIG. 2. However, this is an example, and the idea of the present disclosure is not limited thereto.

As shown in FIG. 2, the one or more resistors of the resistor unit 130A may be connected in parallel between a connector 140D and a switch unit 120D. In this case, the resistances of the resistors may all be different from each other as shown in FIG. 2, or unlike in FIG. 2, some or all of the resistances of the resistors may be the same. However, this is an example, and the idea of the present disclosure is not limited thereto.

The switch unit 120A may make or break electrical connection between the resistor unit 130A and the reference node based on the battery state signal generated by the controller 110A.

To this end, the switch unit 120A may include one or more switches for making or breaking electrical connection between the reference node and the one or more resistors of the resistor unit 130A.

In this case, at least one of the switches may include an electronic switch for making or breaking electrical connection between the reference node and the resistors according to the battery state signal generated by the controller 110A. For example, each of the switches may be one of a field effect transistor (FET), a bipolar junction transistor (BJT), an insulated gate bipolar mode transistor (IGBT), and a relay. However, this is an example, and the idea of the present disclosure is not limited thereto.

The connector 140A may connect the battery pack 100A to an external device (not shown). More specifically, the connector 140A may electrically connect the resistor unit 130A to an external device (not shown).

As described above, an end of the resistor unit 130A may be electrically connected to the reference node via the switch unit 120A, and the other end of the resistor unit 130A may be electrically connected via the connector 140A to an external device (not shown) connected to the connector 140A.

In addition, the external device (not shown) may refer to various devices to be connected to the battery pack 100A. For example, the external device (not shown) may be a charging device configured to charge the battery pack 100A. In addition, the external device (not shown) may be a device that operates by receiving electricity from the battery pack 100A. However, this is an example, and the idea of the present disclosure is not limited thereto.

The battery 150A may include one or more battery cells. In this case, each of the battery cells may include, for example, a lithium-ion battery cell, a lithium polymer battery cell, or the like, but is not limited thereto.

The battery cells may be connected to each other in series, parallel, or series-parallel. The number of battery cells included in the battery 150A and the method of connecting the battery cells of the battery 150A may be determined according to a required output voltage and a required electricity storage capacity.

Figure 1B:
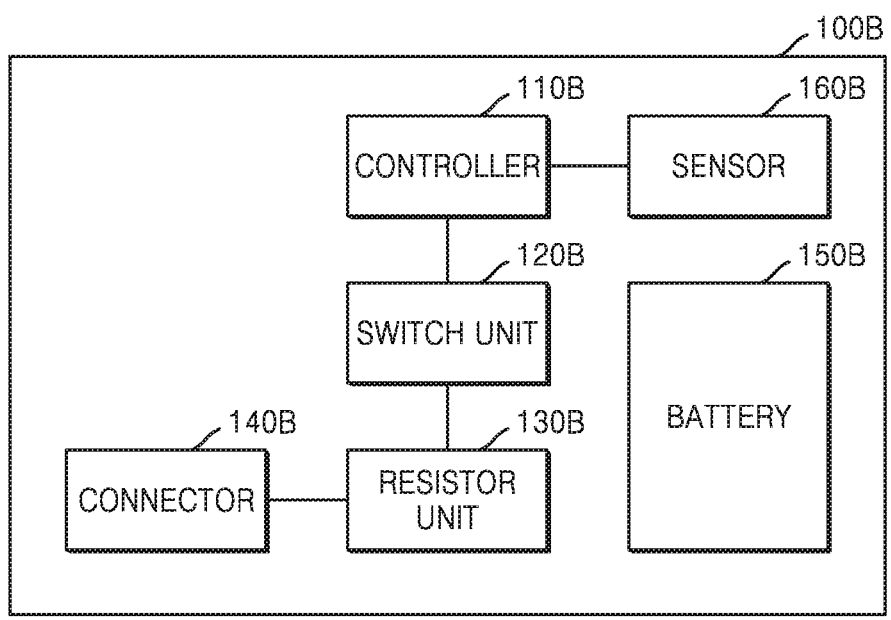

FIG. 1B illustrates the battery pack 100B according to another embodiment of the present disclosure.

Referring to FIG. 1B, the battery pack 100B may include a controller 110B, a switch unit (or switch circuit) 120B, a resistor unit (or resistor circuit) 130B, a connector 140B, and a battery 150B, and may further include a sensor 160B.

The sensor 160B may include various units for sensing the state of the battery 150B. For example, the sensor 160B may include a temperature sensor for sensing the temperature of the battery 150B. In addition to the temperature sensor, the sensor 160B may further include various sensors such as a voltage sensor, a current sensor, or a vibration sensor. However, this is an example, and the idea of the present disclosure is not limited thereto.

In addition, the controller 110B may generate a battery state signal based on the state of the battery 150B sensed by the sensor 160B. For example, when the sensor 160B includes a temperature sensor as described above, the controller 110B may generate a battery state signal based on the temperature of the battery 150B.

Hereinafter, for ease of illustration, it is assumed that the sensor 160B includes a temperature sensor as described above. However, this is an example, and the present disclosure is not limited thereto.

The controller 110B, the switch unit 120B, the resistor unit 130B, the connector 140B, and the battery 150B of the battery pack 100B are the same as those of the battery pack 100A, and thus detailed descriptions thereof will be omitted here.

Figure 1C:
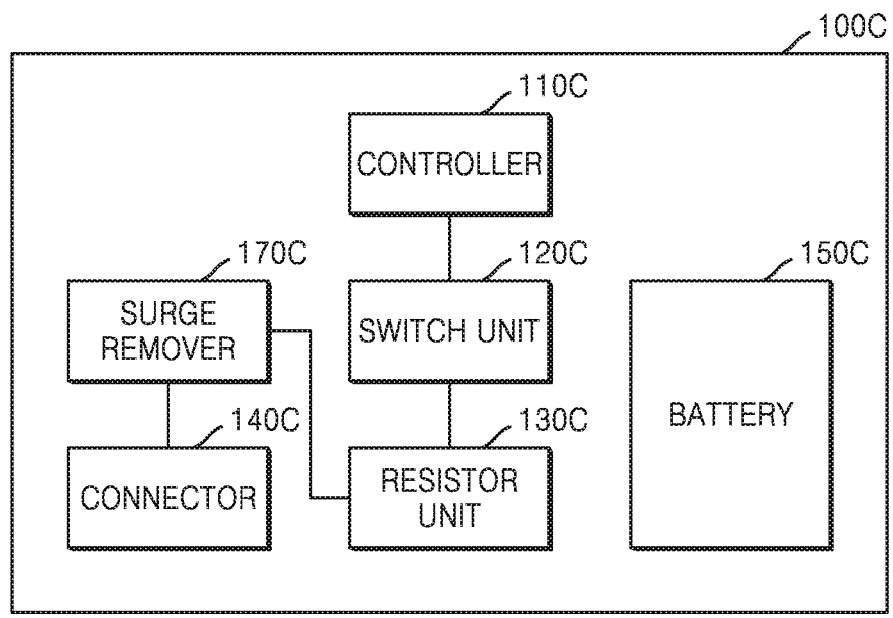

FIG. 1C illustrates the battery pack 100C according to another embodiment of the present disclosure.

Referring to FIG. 1C, the battery pack 100C may include a controller 110C, a switch unit (or switch circuit) 120C, a resistor unit (or resistor circuit) 130C, a connector 140C, and a battery 150C, and may further include a surge remover (or surge removal circuit) 170C.

The surge remover 170C may remove a surge arising along a connection line between the connector 140C and the resistor unit 130C. As described above, an external device (not shown) may be connected to the connector 140C. The surge remover 170C may remove a surge arising when such an external device (not shown) is connected to the connector 140C.

The controller 110C, the switch unit 120C, the resistor unit 130C, the connector 140C, and the battery 150C of the battery pack 100C are the same as those of the battery packs 100A and 100B, and thus detailed descriptions thereof will be omitted here.

Figure 1D:
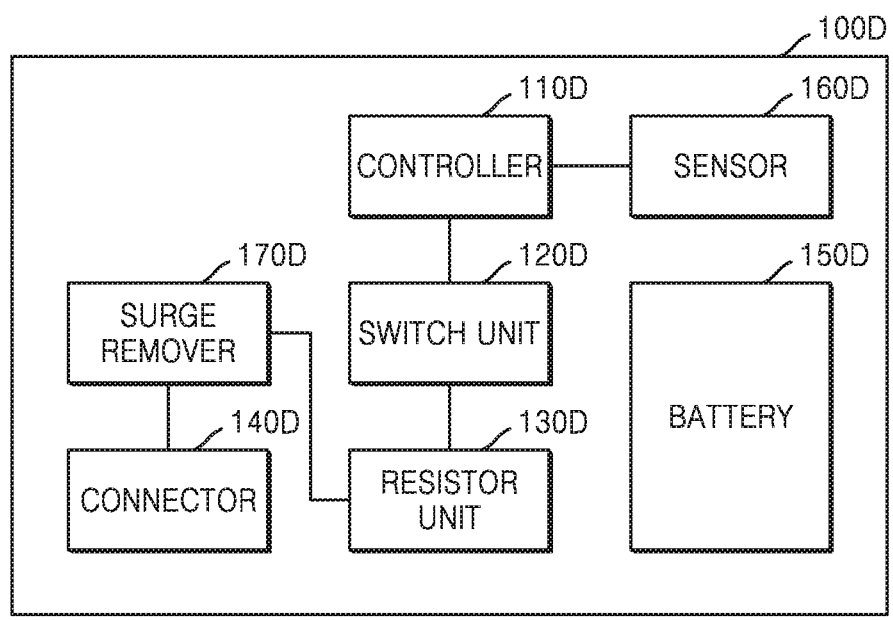

FIG. 1D illustrates the battery pack 100D according to another embodiment of the present disclosure.

Referring to FIG. 1D, the battery pack 100D may include a controller 110D, a switch unit (or switch circuit) 120D, a resistor unit (or resistor circuit) 130D, a connector 140D, and a battery 150D, and may further include a sensor 160D and a surge remover (or surge removal circuit) 170D.

The controller 110D, the switch unit 120D, the resistor unit 130D, the connector 140D, and the battery 150D of the battery pack 100D are the same as those of the battery packs 100A, 100B, and 100C of the previous embodiments, and thus detailed descriptions thereof will not be presented here.

FIG. 2 illustrates an example in which a portion of the battery pack 100D shown in FIG. 1D is implemented as a circuit.

Referring to FIG. 2, as described above, the battery pack 100D may include the controller 110D, the switch unit (or switch circuit) 120D, the resistor unit (or resistor circuit) 130D, the connector 140D, and the surge remover (or surge removal circuit) 170D. The battery pack 100D may also include the battery 150D and the sensor 160D, but the battery 150D and the sensor 160D are not illustrated in FIG. 2.

When the sensor 160D includes a temperature sensor as assumed above, the controller 110D may generate a battery state signal to adjust the impedance between the connector 140D and a reference node GND to a value corresponding to the temperature of the battery 150D sensed by the sensor 160D.

FIG. 3 illustrates operations of switches according to the temperature of the battery 150D. Battery temperatures, sensor impedances and connector-reference impedances in FIG. 3 are merely examples and other values are also possible.

First, for ease of illustration, it is assumed that a charging device (not shown) for charging the battery pack 100D is connected to the connector 140D.

As shown in FIG. 3, when the temperature of the battery 150D is −15 degrees, the state of the battery 150D is not suitable for charging, and thus the battery pack 100D should not be charged.

In some embodiments, when the sensor 160D senses the temperature of the battery pack 100D as −15 degrees (i.e., T<−10° C.), the controller 110D may generate a battery state signal to adjust the impedance between the connector 140D and the reference node GND to a value corresponding to the temperature of the battery 150D sensed by the sensor 160D. In these embodiments, since the impedance corresponding to −15 degrees is 62 k, the battery state signal generated by the controller 110D may be a signal for turning on a switch Q16 which connects a resistor R36 to the reference node GND and turning off the other switches Q10, Q18, and Q9 (see FIG. 2).

In addition, an impedance value corresponding to a temperature may correspond to the impedance of the sensor 160D at the temperature. That is, the impedance of 62 k corresponding to −15 degrees may be the impedance of the sensor 160D at −15 degrees.

In a comparative battery pack example, besides the sensor 160D with which the controller 110D measures the temperature of the battery 150D, a sensor (not shown) with which an external device (for example, a charger (not shown)) measures the temperature of the battery 150D is additionally provided.

That is, since the temperature of the battery 150D is an important factor in the operation of the battery pack 100D, the controller 110D and a charger (not shown) detect the temperature of the battery 150D individually using sensors.

However, this configuration is not desirable because sensors performing the same function are redundantly arranged. For example, the manufacturing costs of the battery pack 100D may increase because the sensors are expensive, and the assemblability of the battery pack 100D may decrease.

However, according to some embodiments, although only the sensor 160D is used, the same battery functionality as in the r comparative battery pack example may be maintained, thereby reducing the manufacturing costs of the battery pack 100D and simplifying the assembly of the battery pack 100D.

According to the disclosed battery pack 100D, manufacturing costs can be markedly decreased by using low-cost resistors and switches, and in addition, the feature of the sensor 160D returning temperatures as impedance values may be implemented using the resistor unit 130D for improving compatibility with an external device (not shown) of the related art.

In another example, when the temperature of the battery 150D is 5 degrees, the battery 150D is chargeable with a current of 2 A.

In this case, the controller 110D may generate a battery state signal to adjust the impedance between the connector 140D and the reference node GND to a value corresponding to the temperature of the battery 150D sensed by the sensor 160D. That is, when the temperature of the battery 150D is 5 degrees (i.e., 0° C.≤T<10° C.), the battery state signal generated by the controller 110D may be a signal for turning on the switch Q10 which connects a resistor R34 to the reference node GND and turning off the other switches Q16, Q18, and Q9. In this manner, the impedance between the connector 140D and the reference node GND may be adjusted to be 14k which is within the impedance range of the sensor 160D at the temperature (see FIG. 2).

Meanwhile, the controller 110D may generate the battery state signal only when the battery pack 100D is connected to an external device (for example, a charging device).

Figure 4:
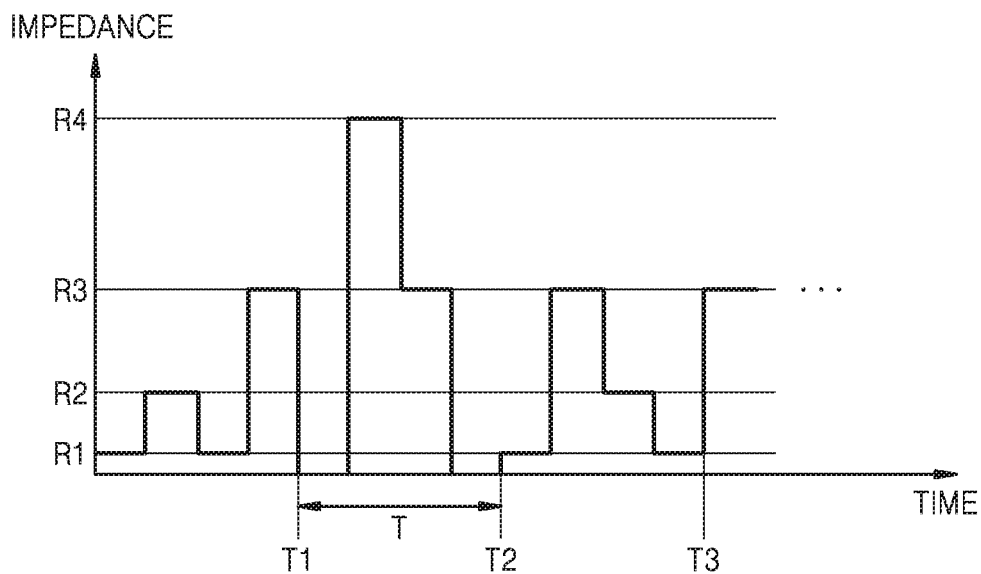
FIGS. 4A and 4B illustrate battery state signals according to another embodiment of the present disclosure.

FIGS. 4A and 4B illustrate battery state signals according to another embodiment of the present disclosure.

In the embodiments described with reference to FIGS. 1A to 3, each of the battery state signals is a static signal having one level (for example, impedance) corresponding to a particular state (for example, a particular temperature).

In some embodiments, a battery state signal may have a waveform in which one or more levels are arranged in a time sequential manner. In this case, each level may mean an impedance value. In other words, a battery state signal may have a waveform corresponding to a particular state (for example, a particular temperature) as shown in FIG. 4B.

As shown in FIG. 4A, such waveforms may be continuously arranged according to predetermined periods T of time to transmit information about the battery pack 100D to an external device connected to the connector 140D.

In addition, although temperature is exemplified as a state of a battery pack in FIGS. 4A to 4B, the idea of the present disclosure is not limited thereto.

Figure 5:
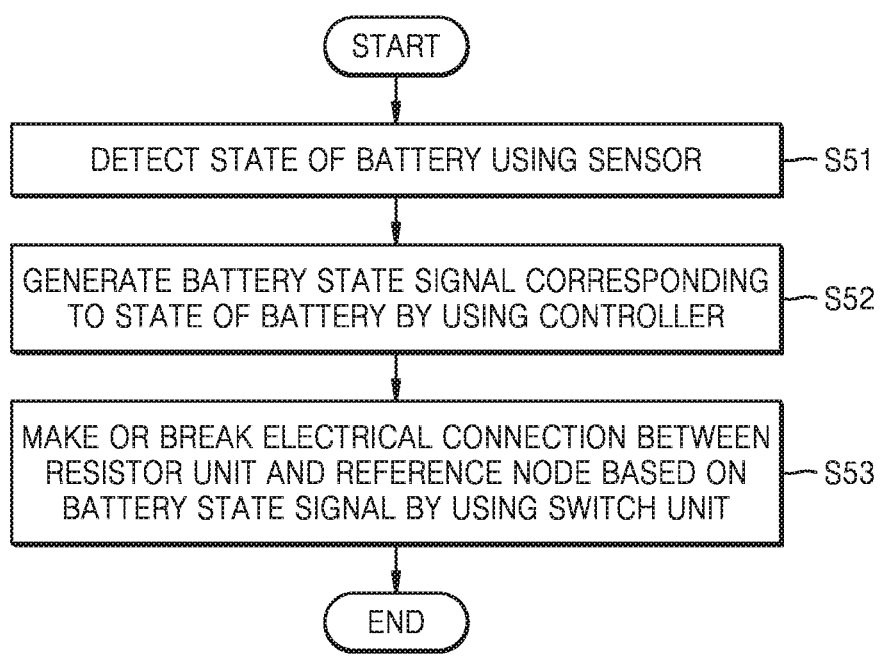
FIG. 5 is a flowchart illustrating a data transmission method performed by a battery pack according to an embodiment of the present disclosure.

FIG. 5 is a flowchart illustrating a data transmission method performed by the battery pack 100D according to an embodiment of the present disclosure. Although the flowchart of FIG. 5 is described herein with reference to a particular order, in various embodiments, states herein can be performed in a different order, or omitted, and additional states can be added.

The sensor 160D senses the state of the battery 150D (S51). For example, the sensor 160D may include a temperature sensor configured to sense the temperature of the battery 150D. In addition to the temperature sensor, the sensor 160D may further include various sensors such as a voltage sensor, a current sensor, or a vibration sensor. However, these are only examples of types of sensors, and the disclosed concepts are not limited thereto.

The controller 110D may check the state of the battery 150D and generate a battery state signal corresponding to the state of the battery 150D (S52). For example, the controller 110D may generate a battery state signal based on the state of the battery 150D sensed by the sensor 160D.

For example, when the sensor 160D includes a temperature sensor configured to sense the temperature of the battery 150D, the controller 110D may generate a battery state signal to adjust the impedance between the connector 140D and a reference node to a value corresponding to the temperature of the battery 150D sensed by the sensor 160D.

The switch unit 120D may make or break electrical connection between the resistor unit 130D and the reference node based on the battery state signal generated by the controller 110D (S53).

Embodiments of the present disclosure have been described. However, it will be apparent to those skilled in the art that various changes and modifications may be made without departing from the spirit and scope of the present disclosure. Therefore, the embodiments described herein should be considered in a descriptive sense only and not for purposes of limitation. The scope of the present disclosure is defined not by the above description but by the following claims, and all differences within equivalent ranges of the scope of the present disclosure should be considered as being included in the scope of the present disclosure.

What is claimed is:

1. A battery pack comprising:
   a battery comprising at least one battery cell;
   a sensor configured to sense a state of the battery;
   a controller configured to generate a battery state signal corresponding to a sensed state of the battery;
   a switch circuit configured to operate based on the battery state signal;
   a resistor circuit configured to be electrically connected to a reference node through the switch circuit, wherein the resistor circuit comprises a plurality of resistors; and
   a connector configured to connect the resistor circuit to an external device,
   wherein the switch circuit comprises a plurality of switches respectively configured to make or break electrical connection between the reference node and the resistors, wherein the plurality of switches are not directly connected to the sensor, and wherein the controller is further configured to adjust a combined impedance between the connector and the reference node to a value corresponding to the sensed state of the battery by turning on at least a first one of the switches and turning off at least a second one of the switches different from the first one of the switches, the combined impedance between the connector and the reference node being independent of an impedance of the sensor.

2. The battery pack of claim 1, wherein the battery state signal comprises a waveform in which one or more levels are arranged in a time sequential manner, and wherein the switch circuit is configured to, based on the battery state signal, make or break electrical connection between the reference node and resistors respectively corresponding to the one or more levels.

3. The battery pack of claim 1, wherein the sensor comprises a temperature sensor configured to sense a temperature of the battery.

4. The battery pack of claim 3, further comprising:

a surge removal circuit configured to remove a surge arising along a connection line between the connector and the resistor circuit.

5. The battery pack of claim 3, wherein the temperature sensor is not directly connected to any of the switch circuit, the resistor circuit and the connector.

6. The battery pack of claim 1, wherein the state of the battery comprises:

at least one of the following: a temperature of the battery, a voltage of the battery, a charge current to the battery, a discharge current of the battery, remaining electricity of the battery, a number of charge cycles of the battery, and identification information of the battery.

7. The battery pack of claim 1, wherein the controller is configured to generate the battery state signal only when the battery pack is connected to a charging device.

8. The battery pack of claim 1, wherein the plurality of switches are respectively connected to different terminals of the controller.

9. The battery pack of claim 1, wherein the sensed state of the battery falls into one of a plurality of ranges, and wherein the combination of the switches turned on and turned off is different depending on the one of the plurality of ranges into which the sensed state of the battery falls.

10. A data transmission method for a battery pack including a battery, the data transmission method comprising:

at a sensor, sensing a state of the battery;

at a controller, generating a battery state signal corresponding to a sensed state of the battery;

making or breaking, at a switch circuit, electrical connection between a resistor circuit and a reference node based on the battery state signal, wherein the resistor circuit comprises a plurality of resistors, the battery pack comprising a connector configured to connect the resistor circuit to an external device; and adjusting, at the controller, a combined impedance between the connector and the reference node to a value corresponding to the sensed state of the battery, wherein the switch circuit comprises a plurality of switches respectively configured to make or break electrical connection between the reference node and the resistors, wherein the plurality of switches are not directly connected to the sensor, and wherein the controller is further configured to adjust the combined impedance by turning on at least a first one of the switches and turning off at least a second one of the switches different from the first one of the switches, the combined impedance between the connector and the reference node being independent of an impedance of the sensor.

11. The data transmission method of claim 10, wherein the battery state signal comprises a waveform in which one or more levels are arranged in a time sequential manner, and wherein the making or breaking of the electrical connection comprise making or breaking, based on the battery state signal, electrical connection between the reference node and resistor respectively corresponding to the one or more levels.

12. The data transmission method of claim 10, wherein the sensor comprises a temperature sensor configured to sense a temperature of the battery.

13. The data transmission method of claim 12, wherein the temperature sensor is not directly connected to any of the switch circuit, the resistor circuit and the connector.

14. The data transmission method of claim 10, wherein the generating of the battery state signal is performed only when the battery pack is connected to a charging device.

15. A battery pack comprising:

a battery comprising at least one battery cell;

a sensor configured to sense a state of the battery;

a controller configured to generate a battery state signal corresponding to a sensed state of the battery;

a switch circuit configured to operate based on the battery state signal;

a resistor circuit configured to be electrically connected to a reference node through the switch circuit, wherein the resistor circuit comprises a plurality of resistors; and a connector configured to connect the resistor circuit to an external device having no switch circuit therein, wherein the switch circuit comprises a plurality of switches respectively configured to make or break electrical connection between the reference node and the resistors, wherein the plurality of switches are not directly connected to the sensor, and wherein the controller is further configured to adjust a combined impedance between the connector and the reference node to a value corresponding to the sensed state of the battery by turning on at least a first one of the switches and turning off at least a second one of the switches different from the first one of the switches, the combined impedance between the connector and the reference node being independent of an impedance of the sensor.

16. The battery pack of claim 15, wherein the sensor comprises a temperature sensor configured to sense a temperature of the battery, and wherein the controller is configured to generate the battery state signal to adjust the combined impedance between the connector and the reference node to a value corresponding to the temperature of the battery sensed by the sensor.

17. The battery pack of claim 15, wherein the controller is configured to generate the battery state signal only when the battery pack is connected to a charging device.

18. The battery pack of claim 15, wherein the sensor comprises a temperature sensor configured to sense a temperature of the battery, and wherein the temperature sensor is not directly connected to any of the switch circuit, the resistor circuit and the connector.

* * * * *